United States Patent [19]

Redwine et al.

[11] 4,281,401

[45] Jul. 28, 1981

[54] SEMICONDUCTOR READ/WRITE MEMORY ARRAY HAVING HIGH SPEED SERIAL SHIFT REGISTER ACCESS

[75] Inventors: Donald J. Redwine; Lionel S. White, Jr.; G. R. Mohan Rao, all of Houston, Tex.

[73] Assignee: Texas Instruments Incorporated, Dallas, Tex.

[21] Appl. No.: 96,957

[22] Filed: Nov. 23, 1979

[51] Int. Cl.[3] .............................................. G11C 11/40
[52] U.S. Cl. .................................. 365/222; 307/238.4; 357/40; 365/189
[58] Field of Search .................. 307/238; 365/174, 78, 365/189, 222, 230; 357/23, 40

[56] References Cited

U.S. PATENT DOCUMENTS 3,560,940  2/1971  Gaensslen ............................ 365/189
4,127,899  11/1978  Dachtera ............................. 365/189

Primary Examiner—Terrell W. Fears
Attorney, Agent, or Firm—John G. Graham

[57] ABSTRACT

A semiconductor memory device of the MOS/LSI type using an array of dynamic one-transistor cells has a high speed serial input/output system. A serial shift register having a number of stages equal to the number of columns in the memory cell array is split into two half registers connected to opposite sides of the columns by transfer gates. The bits in the register may be loaded into the columns of the array and thus to an addressed row of cells, or data in one entire addressed row of cells may be loaded into the shift register stages via the columns and transfer gates. For a write operation, data from external is loaded serially into the shift register, alternating bit by bit between the two half registers. For a read operation, data is serially shifted out of the register to external, again alternating between the half registers. The data register can be advanced at twice the clock frequency. The cell array can be addressed for refresh during the time that data is being shifted into or out of the serial register.

10 Claims, 15 Drawing Figures

SEMICONDUCTOR READ/WRITE MEMORY ARRAY HAVING HIGH SPEED SERIAL SHIFT REGISTER ACCESS

BACKGROUND OF THE INVENTION

This invention relates to semiconductor memory devices and more particularly to a serial shift register access system for an MOS random access type read/write memory.

Semiconductor memory devices of the type made by the N-channel silicon-gate MOS process and employing one transistor dynamic cells are now very widely used in computers and digital equipment. The volume of manufacture of such devices has resulted in a continuing reduction in cost according to "learning curve" theory, and this trend will continue as volume increases. In addition, improvements in line resolution and other factors have made possible increases in bit density during the last few years from 1K through 4K and 16K to 64K bits for devices now in production. This fact has further reduced the cost per bit for this type of computer memory.

Ordinarily a computer of any size, whether it is a main frame, a minicomputer, or a microcomputer, will have several different types of memory. These types may include cache, dynamic RAM, static RAM, EPROM, EAROM, ROM, buffer, magnetic bubble, CCD and several types of disc including fixed head and moving head disc, and magnetic tape. Generally the higher speed of access types are the most expensive and the lower speeds are cheapest, on a per bit basis. Other factors such as ease of programming, volatility, refresh overhead, size, power dissipation, etc., dictate choice of one type over another. One of the most common in current mainframe computers is moving head disc, which is relatively inexpensive, but the access time is slow. Fixed head disc has thus been used as a speed buffer between moving head disc and RAM, at a cost less than RAM but somewhat more than moving head disc.

Different manufacturing methods and equipment, different design efforts for product improvement, and different technology bases have caused the various types of computer memory to fail to take maximum advantage of the economics of scale. For example, one niche in the realm of memory is occupied by CCD's which are serial semiconductor devices adapted to the task of going from moving head disc to RAM, replacing fixed head disc. In spite of the fact that CCD's are basically similar to N-channel MOS RAM's, the vast design and manufacturing expertise available for the mainstream memory products shared by major semiconductor manufacturers has not been applicable to CCD's because of the differing technologies. Thus, this memory product has not kept pace in the areas of manufacturing volume, cost reduction, and bit density increases. For this reason, computer equipment manufacturers have made use of standard dynamic RAM devices to simulate operation of CCD's to accomplish the function of buffering between moving head disc and RAM. This is somewhat cheaper, but the unused speed of dynamic RAM's results in unnecessary costs.

It is the principal object of this invention to provide a semiconductor memory which uses the same basic design of one type of memory, such as MOS dynamic RAM's, to produce another type of memory, such as CCD's, so that the economics of large scale manufacture and the design improvements will be shared. Another object is to provide improved serial access type memory devices which are of lower cost and susceptible to volume production.

SUMMARY OF THE INVENTION

In accordance with one embodiment of the invention, an MOS RAM is made to operate with serial access like a CCD. This is a semiconductor memory device of the MOS/LSI type using an array of dynamic one-transistor cells having a high speed serial input/output system. A serial shift register having a number of stages equal to the number of columns in the memory cell array is split into two half registers connected to opposite sides of the columns by transfer gates. The bits in the register may be loaded into the columns of the array and thus to an addressed row of cells, or data in one entire addressed row of cells may be loaded into the shift register stages via the columns and transfer gates. For a write operation, data from external is loaded serially into the shift register, alternating bit by bit between the two half registers. For a read operation, data is serially shifted out of the register to external, again alternating between the half registers. Data in the register can be advanced at twice the clock frequency. The cell array can be addressed for refresh while data is shifting into or out of the serial register. Thus, the device resembles a standard RAM with no Y decoder or Y address buffers and with a serial register added which is split in half, one half on each side of the cell array. It is thus cheaper to make than the standard RAM, yet shares its production facilities and processes, as well as research and engineering for product improvement.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
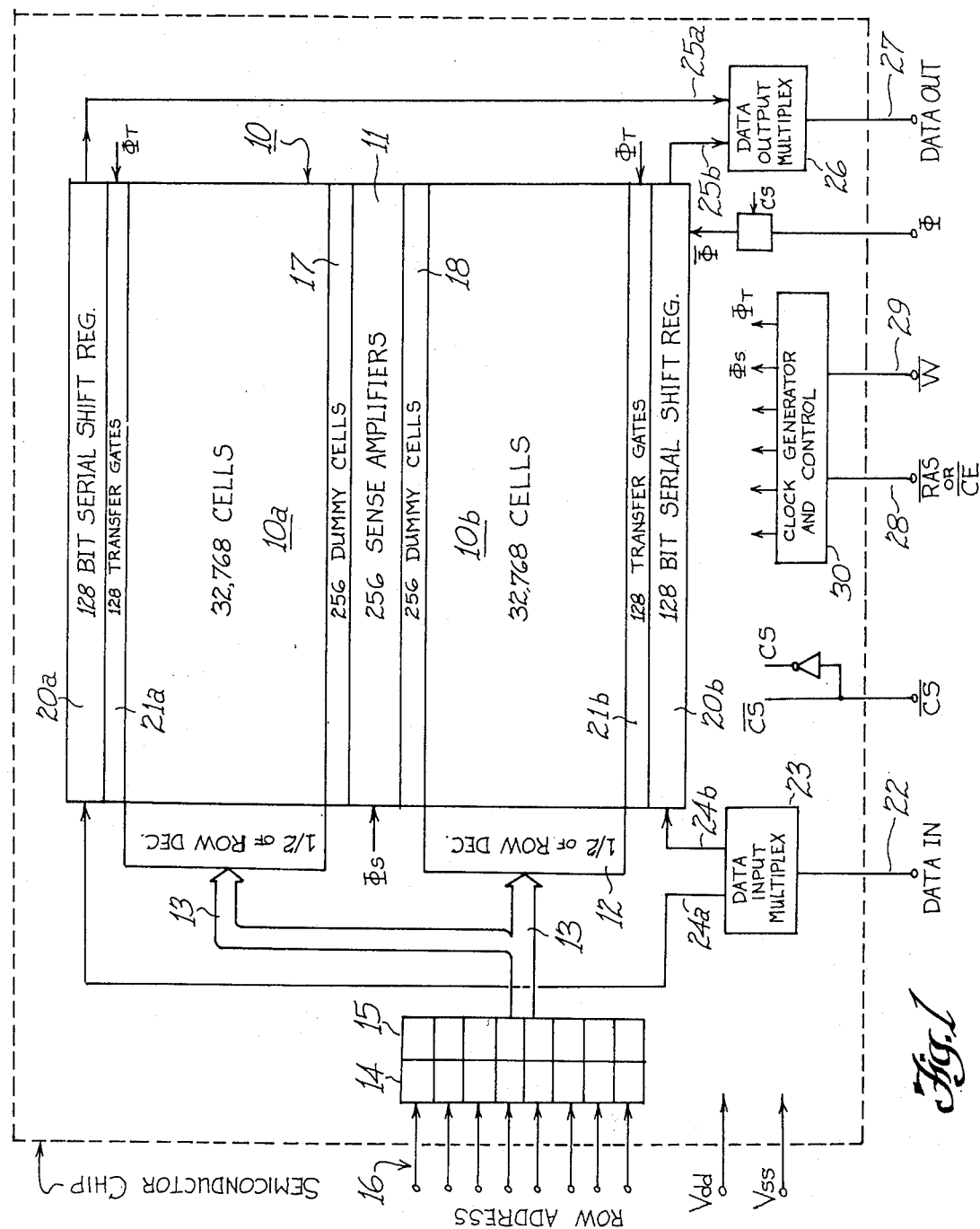
FIG. 1 is an elecrical diagram in block form of a semi-conductor memory device which uses the serial access features and shift register of the invention.

Referring to FIG. 1, a memory device which may utilize the features of the invention is illustrated in block diagram form. This is a serial access, read/write memory using a cell array of the dynamic random access type. It is made by an N-channel, self-aligned, silicon gate, double-level-polysilicon, MOS process. All of the memory device of FIG. 1 is included in one silicon chip of about 1/30 of a square inch in size which usually would be mounted in a standard dual-in-line package having sixteen pins or terminals. The device includes in this example an array 10 of 65,536 memory cells, with the array split into two halves 10a and 10 b of 32,768 cells each, in a regular pattern of 256 rows and 256 columns. Of the 256 rows or X lines, there are 128 in the array half 10a and 128 in the half 10b. The 256 column or Y lines are each split in half with one half being in each of the halves 10a and 10b. There are 256 sense amplifiers 11 in the center of the array; these are differential type bistable circuits made according to the invention disclosed and claimed in U.S. Pat. No. 4,081,701, issued to White, McAdams and Redwine, or Application Ser. No. 944,822, filed Sept. 22, 1978, both assigned to Texas Instruments. Each sense amplifier is connected in the center of a column line, so 128 memory cells are connected to each side of each sense amplifier by a column line half. The chip requires only a single 5V supply Vdd, along with a ground terminal Vss. No internal charge pump is needed because no substrate bias is employed.

A row or X address decoder 12, split into two halves, is connected by sixteen lines 13 to eight address buffers or latches 14 via output circuits 15. The buffers 14 are made according to the invention disclosed in pending application Ser. No, 953,145, filed Oct. 20, 1978 by Reese, White and McAlexander, assigned to Texas Instruments. An eight-bit X address at TTL voltage levels is applied to inputs of the address buffers 14 by eight address input terminals 16. The X decoder 12 functions to select one of the 256 row lines as defined by an eight bit address on the input terminals 16; if the selected row line is in the half 10b of the cell array then a row of dummy cells 17 on the opposite side of the sense amplifiers 11 is also activated, while if a line in the half 10a is selected then a row of dummy cells 18 is activated.

As thus far described, the memory device is similar to a standard dynamic RAM; however, according to the invention, serial input/output is provided instead of single bit or byte-parallel. A 256 bit serial shift register split into two identical halves 20a and 20b with the halves positioned at opposite sides of the array. The shift register may be loaded from the column lines of the array 10 for a read cycle, or loaded into the column lines by 128 transfer gates 21a on one side or a like number of gates 21b on the other side for a write cycle. Data input to the device is by a data-in terminal 22 which is connected through buffer and a multiplex circuit 23 to inputs 24a and 24b of the register halves. Data is read out serially from the register halves 20a and 20b by lines 25a and 25b, a data-out multiplex circuit 26, a buffer, and a data-out terminal 27. The shift register 20a and 20b is operated by a clock $\Phi$ which is used to generate clocks $\Phi 1$ and $\Phi 2$ to shift the bit on the input 24 through the stages of the register, through two inverters for each clock cycle. For write operations it takes only 128 cycles of the clock $\Phi$ to load in 256 bits to fill up the 256 bits of the split register 20a and 20b. Then, a control $\Phi T$ occurs to apply the 256 bits to the 256 column lines in the array halves 10a and 10b. In this write operation, the sense amplifiers 11 are then operated to set the column lines at a full logic level, after which one row line (selected by the address in the latches 14) is actuated and the data forced into the memory cells of this row. A read cycle starts with an address on the inputs 16 which is decoded to actuate one of the 256 X or row address lines (and the dummy cell on the opposite side). The sense amplifiers 11 are then actuated by a $\Phi S$ clock to force the column lines to a full logic level, and then the transfer devices 21a and 21b actuated by $\Phi T$ to move the 256 bits from the selected row into the corresponding shift register half 20a or 20b. The shift clock $\Phi$ then moves the 256 bits onto the output pin 27 in serial format via the multiplex circuit 26, again at two stages per clock cycle or twice the usual rate, requiring 128 clock $\Phi$ cycles.

The X address must appear on the inputs 16 when a row address strobe or chip enable signal as in FIG. 2a, referred to as $\overline{RAS}$ or $\overline{CE}$, is applied to an input 28. A read/write control $\overline{W}$ on an input 29 as seen in FIG. 2b is another control signal for the device. These inputs are applied to clock generator and control circuitry 30 which generates a large number of clocks and control signals to define the operation of various parts of the device. When $\overline{RAS}$ goes low as seen in FIG. 2a, clocks derived from $\overline{RAS}$ cause the buffers 14 to accept and latch the eight bits then appearing on the input lines 16. The row address must be valid during the time period shown in FIG. 2c. For a read operation, the $\overline{W}$ signal on input 29 is high during the period seen in FIG. 2b, and the data output on the terminal 27 will occur during the time period of 128 cycles seen in FIG. 2d. For a write operation, the $\overline{W}$ signal must be low as seen in FIG. 2b and the data-in bits must be valid during the preceeding time period of 128 cycles seem in FIG. 2e. Refresh occurs every time a row address appears on the inputs 16 and $\overline{RAS}$ goes low. Thus, during the 128 cycles when the shift register halves 20a and 20b are being loaded from data-in pin 22 or are being read out through data-out pin 27, refresh can be occurring by loading a new row address into the chip along with a $\overline{RAS}$ signal. The shift register 20a and 20b is not disturbed so long as $\Phi T$ does not occur which is controlled by $\overline{CS}$. Serial data can be shifted into the register halves 20a and 20b while data is being shifted out. Thus a write operation can begin just after a read operation is initiated.

Figure 3:
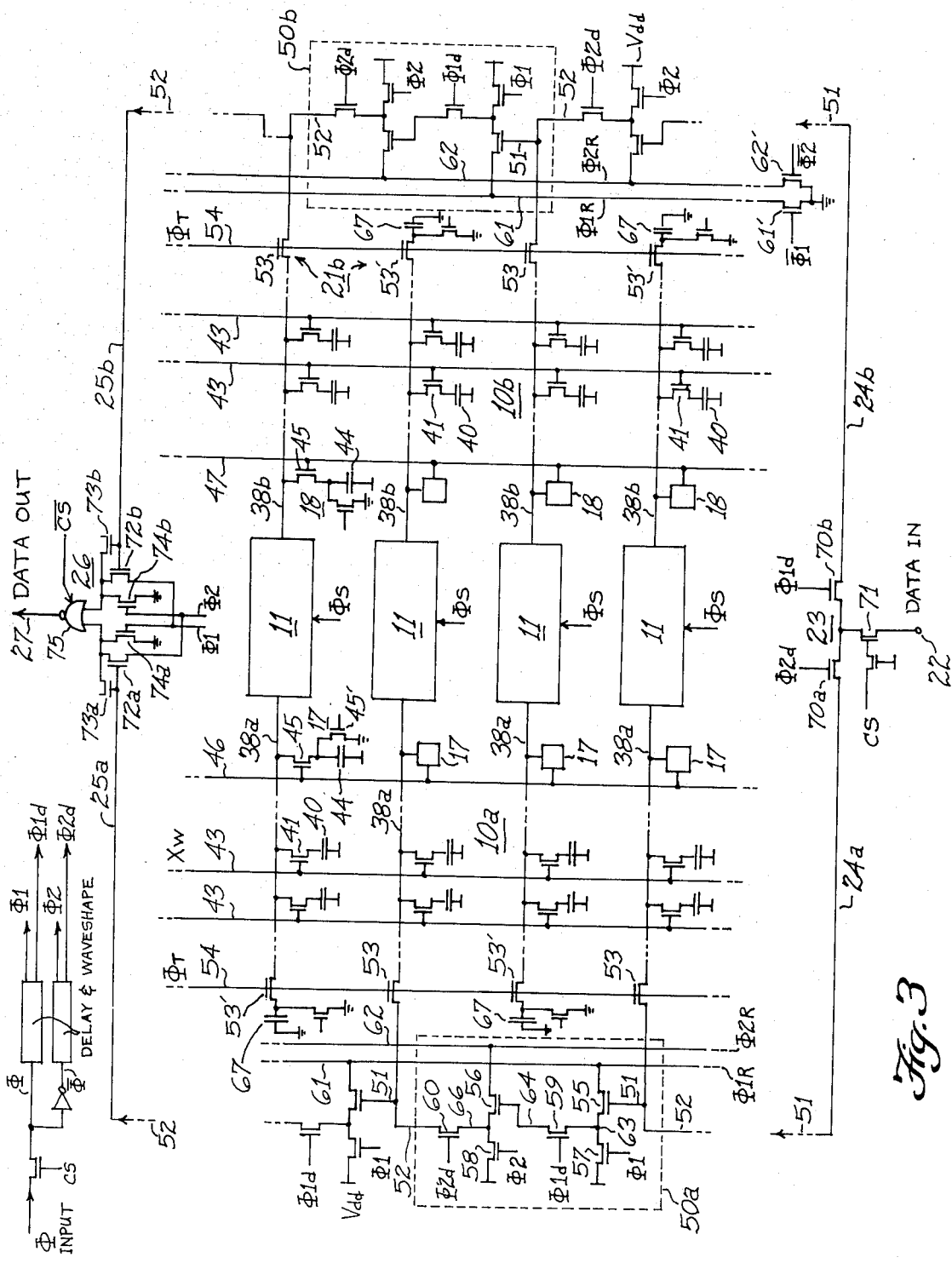
FIG. 3 is an electrical schematic diagram of the cell array and shift registers in the device of FIG. 1.

In FIG. 3, a portion of the cell array and associated shift register stages are shown in schematic form. Four of the 256 identical sense amplifiers 11 positioned at the center of the array are shown connected to the four column line halves 38a or 38b. Connected to each column line half 38a or 38b are 128 one-transistor cells each having a storage capacitor 40 and a transistor 41. The cells are of the type described in pending U.S. Pat. Applications Ser. No. 648,594, filed Jan. 12, 1976 and Ser. No. 722,841, filed Sept. 13, 1976 by C-K Kuo, both assigned to Texas Instruments, or U.S. Pat. No. 4,012,757. Row lines 43 which are the outputs of the row decoders 12 are connected to the gates of all of the transistors 41 in each row; there are 256 identical row lines 43 in the array. Also connected to each column line half 38a or 38b is a dummy cell 17 or 18 which consists of a storage capacitor 44, an access transistor 45 and a grounding transistor 45'. The gates of all dummy cells in a row are connected to a line 46 or 47. When the Xw address selects one of the lines 43 on the left, the associated transistor 41 is turned on to connect the capacitor 40 for this selected cell to the column line half 38a, while at the same time the dummy cell select line 47 on the opposite side is activated, connecting the capacitor 44 in one of the cells 18 to the column line half 38b. The dummy cell capacitance 44 is about ¼ that of the storage cell capacitance 40. The dummy cell is predischarged to a logic zero before every active cycle by the transistor 45'.

The serial I/0 register 20a and 20b is composed of shift register stages 50a or 50b positioned on opposite sides of the cell array. The input 51 of each stage is connected to receive the output 52 of the next preceeding stage, in the usual manner. The register is operated by a two phase clock $\Phi 1$, $\Phi 2$, plus delayed clocks $\Phi 1d$ and $\Phi 2d$, which are derived from a clock $\Phi$ supplied from external to the chip. That is, the clock Φ is used to generate another clock in phase opposition then each of these is used to generate the delayed clocks. The input 24a or 24b of the first of the stages 50a or 50b is from the data-in mulitplex circuit 23, and the output from the last of the stages 50a or 50b goes to the data-out multiplex circuit 26. The transfer gates 21a or 21b consist of 256 identical transistors 53 having the source-to-drain paths in series between the column line halves 38a or 38b and the shift register stages 50a or 50b. The gates of the transistors 53 are connected by a line 54 to the ΦT source.

The stages of 50a or 50b of the shift register are of the four-phase dynamic ratioless type, with improved noise margin and speed characteristics. Also, the shift register stage uses minimum size transistors and dissipates low power. Although four phases are used, two of the clocks Φ1 and Φ2 are the standard two-phase mutually exclusive clocks used in most memory systems. The other two clocks Φ1d and Φ2d are easily derived from the first two. Each stage consists of first and second inverter transistors 55 and 56 with a clocked load transistor 57 and 58 for each inverter. A transfer transistor 59 or 60 couples each inverter to the next. The drains of loads 57 and 58 go to +Vdd, and the sources of inverter transistors 55 and 56 are connected to Φ1R or Φ2R on lines 61 and 62. These are not additonal clocks but instead $\overline{\Phi1}$R and $\overline{\Phi2}$R represent connections to Vss at $\overline{\Phi1}$ and $\overline{\Phi2}$ via transistors 61' and 62'. Instead, the sources could be returned to Φ1 and Φ2.

Figure 2:
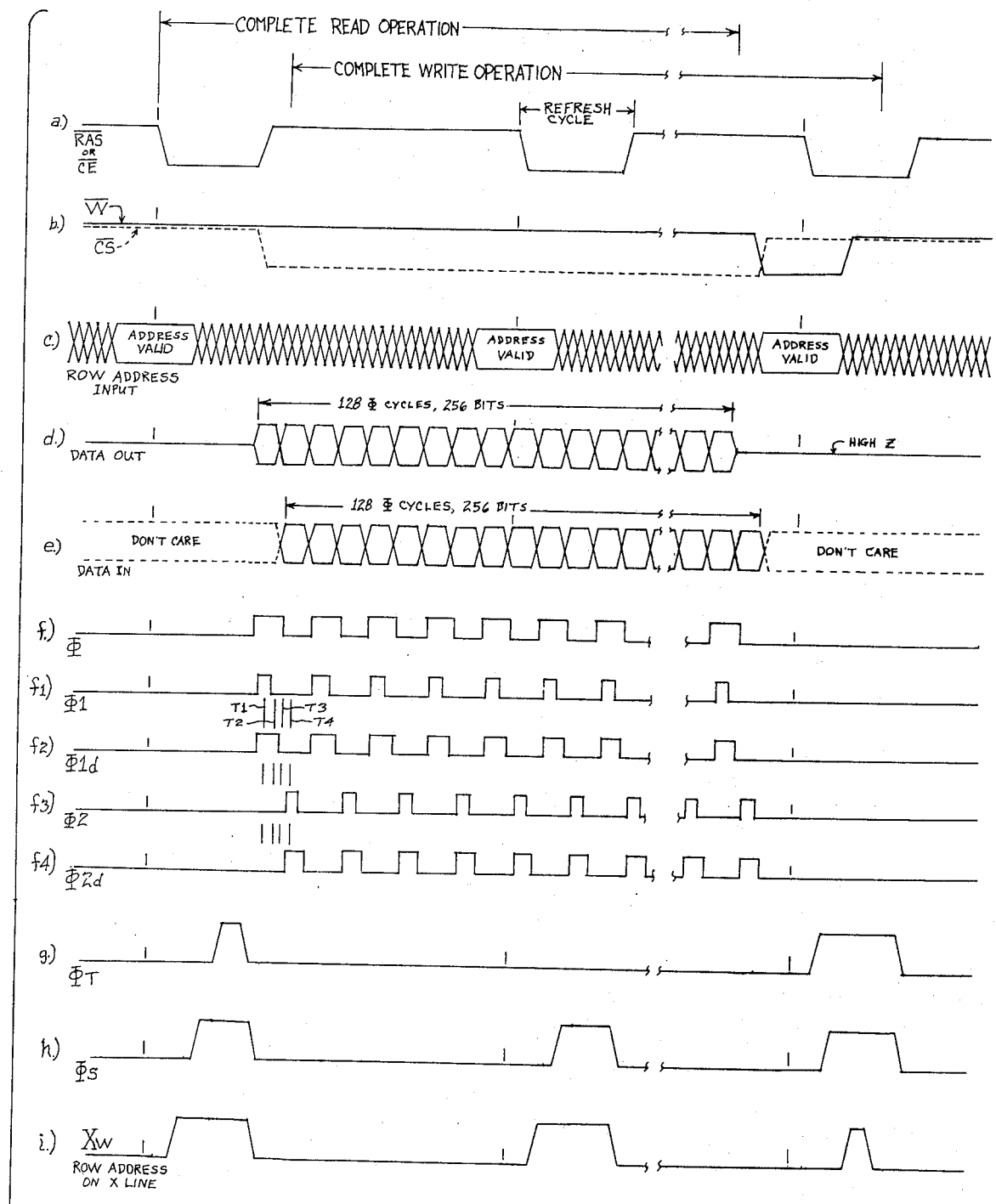
FIGS. 2a-2j are graphic representations of voltage vs. time or other conditions vs. time existing for various parts of the device of FIG. 1.

The operation of one stage may be understood by examining the circuit conditions at each of four distinct instants in time, T1 through T4 seen in FIG. 2. At time T1, Φ1 and Φ1d are high while Φ2 and Φ2d are low; this is an unconditioned precharge period in which transistors 57 and 59 are on and nodes 63 and 64 are charged to a high level. During this time the transistors 58 and 60 are off, implying that the voltage on the nodes 51 and 52 was previously established and is now trapped. The nodes 51 and 52 may be either high or low depending upon the data in the register. Since Φ2 is low and node 64 is being precharged, the transistor 56 will be turned on, discharging node 66 to a low state or Vss back through the source of transistor 56. This action sets up a favorable charge storage condition on node 64 by forcing the drain, channel, and source of transistor 56 to a low state.

At time T2, Φ1 goes low and it is during this time that nodes 63 and 64 may change; they may remain high if there is a low stored on input node 51 or they may go low by discharging through transistor 55 to Vss (Φ1 being low) if there is a high stored on the node 51. In either case the complement of the data on the input node 51 is transmitted to the node 64. As Φ1d goes low, we enter time T3 in which the transistor 59 is cut off and the voltage on the node 64 is isolated, all clocks are low and the circuit is in a quiescent condition.

The time T4 initiates an unconditional precharge time for the second half of the stage bit similar to that occurring during T1, for the first half, with the final result being that by the end of Φ2d the data has been recomplemented and appears on the output node 52. A one-bit or one-stage delay time therefore requires one Φ1, Φ1d clock pair plus one Φ2, Φ2d clock pair.

Two interesting voltage conditions occur on the storage node (as example, the node 64) which will demonstrate why the circuit has such a good noise margin. As previously stated, during time T1 when the nodes 63 and 64 were unconditionally precharged and the drain, channel, and source of the transistor 56 were all brought low, so that by the time the transfer gate 59 is isolated (at time T3) either a full voltage appears across the total gate capacitance (consisting of Cgd, Cgch, Cgs) or no voltage appears across it. Assume that the first voltage condition is a high level stored and isolated on the node 64 by T3 time, then at time T4 when Φ2 goes high, node 64 will be bootstraped to a voltage level higher than what was stored. This condition indicates that the transistor 56 will remain in the triode region throughout the unconditional precharging and conditional discharging of the nodes 66 and 52.

The second voltage condition is a low level stored and isolated on the node 64 by T3 time; as the source and drain of the transistor 56 go high during T4 time, the low level stored on the node 64 will be raised up substantially by the gate-to-source and gate-to-drain capacitances Cgs and Cgd of the transistor 56. However, as the drain and source voltages will always exceed the gate voltage, the transistor 56 will remain off and the circuit will continue to operate.

It is noted that when a high level is stored on the node 64 the unconditional precharging of the nodes 66 and 52 is accomplished through the transistor 56, whereas when a zero is stored on the node 64 then the transistor 58 does the precharging.

It is further noted that since the transistors 57 and 58 normally perform the precharge function, then the sources of the transistors 55 and 56 only need to be discharged at the appropriate time and not necessarily charged. These points could be connected to Φ1 and Φ2 if more convenient in circuit layout. A zero stored on any storage node (51, 64, 52, etc.) results in a maximum high level trapped on the next storage node; when a high level is stored then the precharge level is immaterial. Thus different bits containing different datum will not interfere with each other if the sources of alternate driver transistors (56, 56', for example) are shared. Therefore, the circuit of FIG. 3 functions in the desired manner; this is equivalent to connecting the sources of the driver transistors 55 and 56 individually instead of collectively to Vss through transistors 61' and 62' clocked on $\overline{\Phi1}$ and $\overline{\Phi2}$.

The shift register stages are connected to alternate ones of the column lines 38a or 38b on each side. This provides an advantage in that the six transistors per stage may be more easily laid out to fit between the two alternate column lines rather than between adjacent column lines. The pitch in a dynamic RAM array of the type to be adapted to use the features of the invention is about 0.8 mil; a greater layout area for the six transistors of a shift register stage is available in 2×0.8 or 1.6 mils.

The same result could be accomplished by placing both halves 50a and 50b of the split shift register on the same side of the array, but laid out one above the other. The layout of FIGS. 1 or 3 with all even bits on one side and all odd bits on the other side of the array is advantageous, however, because of the balance for optimum operation of the sense amplifiers.

A dummy transfer transistor 53' is positioned at the end of each column line when not used on that side to connect to a shift register stage. This electrically and physically balances the inputs to the sense amplifiers 11 and also connects to a dummy capacitor which functions when sensing the voltage transferred from the register 20a, 20b. When the ΦT signal appears on line 54, the same amount of noise is coupled to both sides of the column line 38a and 38b through the capacitance of the transistors 53 or 53' on each side, so the noise pulse is in effect cancelled out as an input to the sense amplifiers, and a capacitance 67 like the capacitance 44 is coupled to the column line on the side opposite the stage 50a or 50b being sensed.

A data-in multiplex circuit 23 for directing alternate bits to the inputs 24a or 24b includes a pair of transistors 70a and 70b which have gates driven by Φ1d and Φ2d. A transistor 71 in series with these has the chip select signal CS on its gate, so data only goes into the shift register of the selected chip or chips in a large memory board. A data output multiplex circuit 26 includes transistors 72a and 72b having Φ1 or Φ2 on their drains and the last stage outputs 25a or 25b on their gates; gated capacitors 73a or 73b couple each gate to its respective source. Transistors 74a and 74b short the output of one to Vss when the other is valid, being driven by Φ1 and Φ2. A NOR gate 75, actuated by $\overline{CS}$, produces the output to terminal 27. The output multiplex circuit 26 could also be designed to hold the data bits after Φ1 or Φ2 go off, if desired.

It is important to note that the data-in or data-out rate is twice the clock rate Φ. Only 128 Φ cycles are needed to transfer in or transfer out 256 bits. This result is accomplished due to the fact that the shift register is split. Two clocks are needed to shift a bit of data one position, so if all 256 stages were in series, then 256 clock cycles would be needed. A part of this type using present specifications can be clocked at about 10 MHz maximum, so a data rate of 20 MHz is possible. This is higher than typical CCD's, for example.

It is also important that the timing of the ΦT, ΦS and Xw (the high voltage on the selected X line 43 representing the one line 43 defined by the row address input) signals is different for read, refresh and write. The voltages are seen in FIGS. 2g, 2h and 2i; read and refresh are the same except refresh has no ΦT, and reversal for write is necessary because of the reversed sequence. In the case of a read cycle the data from a row of the memory capacitors 40 is transferred through a row of transistors 41 by the Xw voltage to the column lines, then detected by the sense amplifiers 11 at ΦS, then loaded through the transfer gates 21a, 21b at ΦT to the shift register 20a, 20b. The opposite must occur for the write cycle where the transfer gates 21a, 21b must turn on first at ΦT as the data in the shift register is transferred to the column lines 38b, then data is sensed at ΦS, after which Xw goes high momentarily to turn on a selected row of transistors 41 and thus load the data state of the serial shift register into the row of capacitors 40 in the cell array 10.

The proper sequence is selected by sensing the $\overline{W}$ command at the start of a cycle, just as an address is sensed, and employing this information in the clock generators 30. ΦT, generated from occurrence of $\overline{RAS}$, $\overline{CS}$ and $\overline{W}$, is switched in timing between early or late compared to $\overline{RAS}$ depending upon whether $\overline{W}$ is low or high.

One example of advantageous use of the device disclosed herein is as a replacement for a charge coupled device or CCD as ordinarily employed to accept serial data from a moving head disc memory and then transfer it into a RAM. The advantage of the device of the invention is that it can be manufactured at a lower cost than a standard dynamic RAM since it has no Y input buffers, Y decoder, or Y clock generator circuits and uses the same manufacturing facilities and process. Also cell size may be reduced because speed demands are reduced, which also allows a reduction in standby power as the buffers need not be as fast. Compared to CCD's, fewer masks and implants are needed in manufacture, bar size is smaller, and complexity of peripheral support circuitry is less. As dynamic RAM's are scaled down in size, and larger arrays are built such as the 256K RAM, a device of the type disclosed herein will be a low cost fall-out requiring little additional engineering and development.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A semiconductor memory device fabricated in a single MOS/LSI integrated semiconductor circuit, comprising:
   an array of M rows and N columns of random access type memory cells, where M and N are integral powers of two;
   N sense amplifiers each one connected to one of the columns;
   a serial shift register split into two separate registers, each separate register having N/2 stages, one stage associated with each of said columns;
   two separate sets of transfer means for loading bits into the two shift registers from alternate ones of said columns in response to a transfer signal;
   means for receiving an address from a source external to the device and for addressing the array for selecting one of the rows for actuation; and
   means for transmitting data serially out of said register to external, the data being alternated bit-by-bit from the two separate registers.

2. A device according to claim 1 wherein the memory cells are of the dynamic read/write type which employ MOS transistors and capacitors, and the means for addressing actuates the gates of all transistors in a row of said cells.

3. A device according to claim 2 wherein the sets of transfer means comprise a plurality of transfer gates each connected between alternate ones of the column lines and one of said stages of the two separate registers.

4. A device according to claim 3 wherein means are provided for actuating the sense amplifiers for refresh separately from said means for loading.

5. A device according to claim 3 wherein the two separate registers are located on opposite sides of the array.

6. A semiconductor memory device fabricated in a single integrated semiconductor circuit, comprising:
   an array of rows and columns of read/write, random access type memory cells;
   a plurality of sense amplifiers each connected to one of the columns;
   a serial shift register split into two separate registers, each separate register having a number of stages equal to half the number of said columns;
   means for loading the contents of the shift register stages onto said columns and for loading bits from the columns into the shift register stages in response to a transfer signal;

means for addressing the device for selecting one of the rows for actuation; and means for loading data serially into said serial shift register or serially out of said register, the data being alternated bit-by-bit between the two separate registers.

7. A device according to claim 6 wherein the memory cells are of the one-transistor dynamic type, employing MOS transistors and capacitors.

8. A device according to claim 6 wherein the two separate registers are located at opposite sides of the array.

9. A device according to claim 8 wherein means are provided for actuating the sense amplifiers for refresh separately from said means for loading.

10. A device according to claim 8 wherein the means for loading includes two separate sets of transfer devices connected between the stages and opposite column line halves.

* * * * *